United States Patent
Keränen et al.

(10) Patent No.: US 10,288,800 B1
(45) Date of Patent: May 14, 2019

(54) MULTILAYER STRUCTURE WITH EMBEDDED LIGHT SOURCE AND LIGHT-GUIDING FEATURES AND RELATED METHOD OF MANUFACTURE

(71) Applicant: TACTOTEK OY, Oulunsalo (FI)

(72) Inventors: Antti Keränen, Oulunsalo (FI); Mikko Heikkinen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 16/214,050

(22) Filed: Dec. 8, 2018

(51) Int. Cl.
| | |
|---|---|
| *F21V 8/00* | (2006.01) |
| *H05K 1/02* | (2006.01) |
| *H05K 3/28* | (2006.01) |
| *H05K 1/18* | (2006.01) |

(52) U.S. Cl.
CPC ......... *G02B 6/0091* (2013.01); *G02B 6/0033* (2013.01); *G02B 6/0063* (2013.01); *G02B 6/0065* (2013.01); *G02B 6/0068* (2013.01); *G02B 6/0083* (2013.01); *H05K 1/0274* (2013.01); *H05K 1/185* (2013.01); *H05K 3/284* (2013.01); *H05K 2201/10106* (2013.01); *H05K 2203/1316* (2013.01)

(58) Field of Classification Search
CPC .. G02B 6/0091; G02B 6/0033; G02B 6/0065; G02B 6/0063
See application file for complete search history.

(56) References Cited

U.S. PATENT DOCUMENTS

| | | | | |
|---|---|---|---|---|
| 2006/0266081 | A1* | 11/2006 | M'Saad | C23C 16/401 65/386 |
| 2014/0313771 | A1* | 10/2014 | Song | G02B 6/0073 362/611 |
| 2015/0301274 | A1* | 10/2015 | Sherman | G02B 6/0068 362/606 |

* cited by examiner

*Primary Examiner* — Joseph L Williams
(74) *Attorney, Agent, or Firm* — Robert P. Michal, Esq.; Carter, DeLuca & Farrell LLP

(57) ABSTRACT

An integrated multilayer structure including a substrate film having a first side and an opposing second side; electronics including at least one light source, provided upon the first side and a number of electrical conductors, at least electrically coupled to the at least one light source which is configured to emit light in selected one or more frequencies or wavelengths; an optically transmissive element including thermoplastic optically transmissive material having a first refractive index and produced onto the first side of the substrate film so as to at least partially embed the at least one light source therewithin; and optical cladding including material having a lower refractive index than the first refractive index and provided adjacent the optically transmissive element upon the first side of the substrate film.

20 Claims, 4 Drawing Sheets

MULTILAYER STRUCTURE WITH EMBEDDED LIGHT SOURCE AND LIGHT-GUIDING FEATURES AND RELATED METHOD OF MANUFACTURE

FIELD OF THE INVENTION

Generally the present invention relates to multilayer structures in connection with electronics, associated host devices and structures as well as methods of manufacture. In particular, however not exclusively, the present invention concerns provision of an integral illumination solution within a multilayer structure.

BACKGROUND

Generally there exists a variety of different stacked assemblies and structures in the context of e.g. electronics and electronic products such as various electronic devices.

The motivation behind stacking electronics and other elements in a common structure may be as diverse as the related use contexts. Relatively often size savings, weight savings, cost savings, usability benefits, or just efficient integration of components in terms of e.g. the manufacturing process or logistics is sought for when the resulting optimized solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle and particularly automotive electronics, etc.

Electronics such as electronic components, ICs (integrated circuit) and conductors may be generally provided onto a substrate element by a plurality of different techniques. For example, ready-made electronics such as various surface mount devices (SKID) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not necessarily always the case.

A substrate such as a plastic substrate film, may be subjected to processing, e.g. (thermo)forming or molding. Indeed, using e.g. injection molding or casting a plastic layer may be provided on the film, potentially then embedding a number of elements such as electronic components present on the film. The plastic layer may have different mechanical, optical, electrical, thermal, etc. properties. The obtained multilayer, or stacked, structure may be configured for a variety of purposes depending on the included features, such as electronics, and the intended use scenario and related use environment. It may, for instance, comprise connecting features for coupling with compatible features of a host device or generally host structure, or vice versa.

Yet, the concept of injection molded structural electronics (IMSE) actually involves building functional devices and parts therefor in the form of a multilayer structure, which encapsulates electronic functionality, typically as seamlessly as possible. Characteristic to IMSE is also that the electronics is often, not always, manufactured into a true 3D (nonplanar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment. In addition to or instead, 3D assembly of electronics may be utilized.

Occasionally different elements, surfaces or devices, such as the ones consisting of or comprising an IMSE structure, should be provided with illumination capability that may bear e.g. decorative/aesthetic or functional, such as guiding or indicative, motive. For example, the environment of the element or device should be floodlit for increasing visibility in the gloom or dark during night-time, which may, in turn, enable trouble-free performing of various human activities typically requiring relatively high lighting comfort, such as walking or reading, to take place. Alternatively, the illumination could be applied to warn or inform different parties regarding e.g. the status of the host element or connected remote device via different warning or indicator lights. Yet, the illumination might yield the host element a desired appearance and visually emphasize its certain features by providing e.g. brighter areas thereon with desired color. Accordingly, the illumination could also be applied to instruct a user of the device about e.g. the location of different functional features such as keys, switches, touch-sensitive areas, etc. on the device surface, or about the actual function underlying the illuminated feature.

Thus, there are various use cases for illumination in conjunction with different IMSE structures and devices. As the illumination may not, however, always be a critical or sole feature of highest priority or of most importance in the associated product, and it may be at least occasionally considered a supplementary, optional feature only, the design and implementation of lighting features providing the desired illumination effect shall be duly executed. Weight and size requirements, elevated power consumption, additional design considerations, new process steps, and generally increased overall complexity of the manufacturing phase and of the resulting product are all examples of numerous drawbacks easily materialized as a side effect of adopting sub-optimum lighting features in the target solution. Yet, the appearance of the lighting effect and e.g. perceivability of lighting elements is one other issue. In some applications, the light sources should remain hidden or weakly exposed or the lighting effect should avoid easily recognizable hotspots.

Optically, many solutions that in principle accomplish their purpose in terms of light conveying or illumination performance in the context of IMSE still suffer from problems including light leakage, crosstalk and transmission loss (attenuation), which may be due to incoherent scattering and absorption among other reasons.

SUMMARY

The objective of the present invention is to at least alleviate one or more of the above drawbacks associated with the existing solutions in the context of various electronic devices or other host elements that are provided with lighting features.

The objective is achieved with the embodiments of a multilayer structure and a related method of manufacture in accordance with the present invention.

According to one aspect and preferred embodiment of the present invention, an integrated multilayer structure comprises a substrate film having a first side and an opposing second side;

electronics comprising at least one light source, optionally a LED, provided upon the first side of the substrate film and advantageously a number of electrical conductors at least electrically coupled to the at least one light source, the at least one light source being configured to emit light at least in a selected frequency/frequency band(s) or corresponding wavelength(s) (a skilled person naturally acknowledges the somewhat straightforward inverse relationship between the two, freq×wavelength=speed of light), optionally including or in some embodiments limiting to all or selected wavelengths of visible light;

an optically transmissive element comprising thermoplastic optically transmissive, having regard to the selected frequencies or wavelength(s), material having a first refractive index and produced, preferably through utilization of molding from said optically transmissive thermoplastic material, onto at least the first side of the substrate film so as to at least partially embed the at least one light source therewithin; and optical cladding comprising material having a lower refractive index than the first refractive index and provided adjacent the optically transmissive element upon the first side of the substrate film;

wherein the at least one light source, the optically transmissive element and the optical cladding have been mutually configured so as to convey light emitted by the light source within the optically transmissive material of the optically transmissive element, at least portion of the conveyed light undergoing a substantially total internal reflection when incident upon the optical cladding.

For example, the cladding may be provided adjacent the transmissive element such that it is in contact with and borders, at least in places (locally if not mostly or basically everywhere) the optically transmissive element at a periphery thereof.

In preferred embodiments the at least one light source, the transmissive element and the cladding have been mutually aligned so that at least about 30% or 50%, more preferably at least about 75%, even more preferably at least about 90%, and most preferably substantially all of the light emitted by the source (at least in the frequencies/wavelengths of interest such as visible light, for example) and entered the transmissive element reaches, advantageously at least for a first time in terms of potentially multiple of such interactions, an interface between the transmissive element and the cladding with an angle exceeding the critical angle between the two, i.e. angle defined by arcsin (refractive index of cladding/refractive index of transmissive element). Accordingly, the portion of light reaching the interface with a larger angle than the concerned critical angle is essentially fully reflected. In this context a critical angle of incidence is measured relative to a surface normal.

Yet, in some embodiments there may be several films, or particularly substrate films, arranged in the structure; for example, there may be at least one film on each side of the cladding.

In various, either supplementary or alternative, embodiments the at least one light source includes, in addition to or instead of at least one mounted such as surface mountable component type light source (e.g. LED), one or more light sources, such as OLEDs (organic LED), which have been additively produced such as printed directly upon the substrate film so as to exhibit a desired shape in terms of physical appearance, such as dimensions, and/or light emission pattern thereof.

Generally, a number of elements provided in the multilayer structure are thus at least partially additively produced by printed electronics technology, with reference to the at least one light source, one or more electrical conductors and/or the cladding, for example.

In various, either supplementary or alternative, embodiments the cladding has been configured, in terms of related material, optically substantially transparent having regard to the selected frequencies or wavelengths.

In at least some, either supplementary or alternative, embodiments the optical cladding is formed from several, physically separate or connected (integral), layers and/or generally elements preferably having at least a portion of the optically transmissive element in between, wherein two or more layers of the cladding optionally extend at least locally essentially parallel to the surface of the substrate film. Additionally or alternatively, the cladding may extend at least locally transversely relative to the substrate film, for example, when it contacts and/or follows component shape(s) or the shape(s) of the transmissive element. A layer or piece of the cladding or the cladding in general may be substantially planar or it may be three-dimensional, and follow e.g. substrate, transmissive element and/or other adjacent layer shapes and/or component shapes.

In various embodiments, the cladding may thus establish at least one, neighbouring and preferably also physically contacting, layer for the transmissive element in any direction relative thereto. As repeated also hereinelsewhere, the actual use orientation of the multilayer structure may vary in a use scenario dependent manner but if considering the multilayer structure as a structure wherein the substrate film is positioned below the transmissive element, there may be cladding provided below the transmissive element, i.e. between the substrate film and the transmissive element. Additionally or alternatively, at least portion of the cladding could be provided on a side of the transmissive element (next to the transmissive element) and/or on top of it. The cladding may comprise a portion such as a layer that is at least partially parallel or conforms to e.g. the substrate film. Yet, it may comprise a portion such as a layer that is at least partially perpendicular to the substrate film and/or parallel to or conforming to e.g. the side(s) of the transmissive element. Accordingly, the cladding may be considered to form at least portion of one or more reflective walls of a number of light channels having the transmissive element as an inner optically transmissive core within the multilayer structure.

In various, still either supplementary or alternative embodiments, the optical cladding comprises at least one layer between the substrate film and the transmissive element, preferably in contact with any of the film and the transmissive element; and at least one other layer on the opposite side of the transmissive element relative to the substrate film, preferably being in contact with the transmissive element and/or located between the transmissive element and an optional light blocking element. Features of potential light blocking elements are discussed hereinlater in more detail.

Yet, the optical cladding may comprise a number of e.g. transverse portions such as side walls, which may optionally connect the aforementioned at least one layer and at least one other layer together, the cladding thereby potentially covering the transmissive element from essentially all directions at least in places.

In various, either supplementary or alternative, embodiments the substrate film comprises, at least locally, at least one element selected from the group consisting of: optically transparent material, transmissive material, translucent material, opaque volume, transparent volume, translucent volume, transmissive volume, opaque material, opaque coating, translucent coating, optically absorptive material, optically absorptive coating, absorption area, light scattering material, scattering area, light scattering coating, reflective material, reflective coating, color film, color coating, color pigment, color dye, luminescent material, printed layer, ink, colored ink, graphical pattern, and graphical figure.

In various, either supplementary or alternative, embodiments the structure further comprises an optionally substantially opaque light absorption or scattering element optionally located essentially between the substrate film and the optically transmissive element. The absorption or scattering element may exhibit at least one selected color, optionally provided by color pigment, color dye, color coating or color film comprised in the element. The absorption or scattering element may have been printed or otherwise produced on the substrate film, or positioned thereon as a ready-made element, for instance.

In various, either supplementary or alternative, embodiments the structure further comprises at least one additional film on the optically transmissive element, on an opposite side thereof relative to a side facing the substrate film. The additional film may optionally host or is at least adjacent at least part of the optical cladding. When accommodating other element(s) such as cladding, other optical features or electronics, the additional film may be considered a further substrate film in terms of its function.

The additional film may comprise, at least locally in one or more places, at least one element selected from the group consisting of: optically transparent material, transmissive material, translucent material, opaque volume, transparent volume, translucent volume, transmissive volume, opaque material, opaque coating, translucent coating, optically absorptive material, optically absorptive coating, absorptive area, light scattering material, scattering area, light scattering coating, reflective material, reflective coating, color film, color coating, color pigment, color dye, luminescent material, printed layer, ink, colored ink, graphical pattern, graphical figure, electrical element (e.g. conductive trace, electrode, contact pad), and electronic component.

In various, either supplementary or alternative, embodiments at least one light exit element may have been arranged in the structure, preferably adjacent the optically transmissive element to outcouple light conveyed within the transmissive element and incident on the exit element. The light exit element(s) may thus enable or at least take part in, besides outcoupling light from the transmissive element, outcoupling light from the overall multilayer structure e.g. into the environment of the structure. For instance, the exit element(s) may be additively produced, subtractively produced and/or implemented through omitting at least part of selected feature(s) such as cladding material from a target surface, e.g. from the surface of the substrate film, transmissive element or additional film.

The light exit element may comprise at least one element selected from the group consisting of: through-hole defined in and by the material of the optical cladding to enable the conveyed light incident thereon to pass therethrough, surface relief structure, grating structure, prism structure, cladding free area or volume between the substrate film and the optically transmissive element the conveyed light is incident on, optical mask free area or volume between the transmissive element and the surface of the structure, refractive outcoupling element, diffractive outcoupling element, outcoupling element comprising optically substantially transmissive, optionally translucent or substantially transparent, material having regard to the frequency or frequency band, optically transmissive material exhibiting selected one or more colors, and outcoupling element comprising optically transmissive material with refractive index similar or higher than the first refractive index.

The constituent elements of the above list may be flexibly selectively combined as being appreciated by a skilled person to come up with a desired light exit element for each embodiment of the multilayer structure. For instance, the through-hole formed may be provided with a selected fill material/outcoupling element that has a higher refractive index than the second refractive index, preferably even higher than the first refractive index.

In various, either supplementary or alternative, embodiments an essentially opaque, optionally reflective, absorptive or scattering, optical blocking element has been provided substantially adjacent the optically transmissive element and/or optical cladding in the multilayer structure. The blocking element may define, for instance, at least a portion of light propagation, leakage, and/or crosstalk limiting masking structure such as of a light channel separating wall or support structure within the overall structure. The blocking element may be configured to essentially cover or border the transmissive element and/or optical cladding in the surface and/or transverse directions of the substrate film at least selectively.

A skilled person shall further acknowledge the fact that various elements discussed herein having a certain function associated therewith, such as a light scattering or light exit function, may also be cleverly combined into a common element or structure. For example, e.g. a color coated or more thoroughly colored film may be provided with through-hole or essentially transparent window filled with another material. Thus a common element may in a spatially separated fashion produce several effects. Alternatively, e.g. scattering material could be applied in the hole as it may still let the light pass through to a sufficient degree, thus implementing a combined scattering and exit element. Accordingly, even essentially the same area or volume of an element may implement multiple desired functionalities. Yet, a blocking element or a blocking function may be implemented together with, or factually by, an absorption and/or scattering element or function in a common element or structure, and specifically thus even in the exactly same portion or location of the common element or structure.

As being appreciated by a skilled person, a number of various elements of the multilayer structure, such as the substrate film, optional additional film, cladding, blocking element, transmissive element, absorption or scattering element, and/or light exit element, and potentially the multilayer structure in general, may exhibit a non-planar, three-dimensional shape at least locally, with reference to e.g. a locally curved or angular shape. Alternatively, substantially flat film(s), selected other layer(s) and/or the overall structure may be preferred and thereby constructed.

For the sake of completeness and should be anyway clear, it shall be mentioned that in some embodiments the multilayer structure may contain a number of further elements that may be identical to, similar with or more clearly different from the ones discussed herein in terms of structure, function and/or e.g. positioning or other aspects of related configuration. For example, the multilayer structure or particularly e.g. a substrate film therein could be provided with one or more additional light sources that are, however, not embedded in the material of the transmissive element or connected thereto optically in a manner congruent with the at least one light source specifically discussed herein.

In accordance with an additional aspect and preferred embodiment of the present invention, a method of establishing an integrated multilayer structure may be provided, comprises:

obtaining a substrate film configured to accommodate electronics on at least first side thereof, said film having the first side and a second side;

providing electronics comprising at least one, optionally printable or mountable, light source such as LED upon the first side of the substrate film and a number of electrical conductors, preferably by printed electronics technology, connecting to the at least one light source; and establishing, preferably through molding or casting, an optically transmissive element onto the first side of the substrate film and thereby at least partially embedding the at least one light source, the transmissive element being established from thermoplastic optically at least translucent, preferably transparent, material having a first refractive index, wherein it is also established, optionally through printing, dip coating, spraying, and/or at least partially jointly with the substrate film, optical cladding, such as one or more cladding layers, to locate adjacent the optically transmissive element upon the first side of the substrate film, said optical cladding comprising material having a lower refractive index than the first refractive index.

In some embodiments, at least portion of an element such as of the transmissive element could be provided on the second side of the substrate film, optionally through an additional manufacturing step such as a molding step and/or via utilizing e.g. an opening such as a cut or through-hole in the substrate film enabling molten and/or flowing plastic material used for forming the transmissive element to flow between the sides of the substrate film and establish desired structures on the both sides. Accordingly, electronics such as one or more light sources, other components, optical elements and/or conductors could be provided on the second side and optionally at least selectively embedded in the overmolded or generally over-applied plastics of the transmissive element.

In various embodiments, the optical cladding could be provided e.g. selectively upon one or more areas on the first side of the substrate film, potentially omitting the locations of one or more elements already provided or to be provided thereon, such as the location of at least one element selected from the group consisting of: the at least one light source, an electrical conductor, and a light absorption or scattering area or element, optionally prior to provision of the one or more selected elements on the substrate film.

On the other hand, the optical cladding could be provided substantially non-selectively upon the first side of the substrate film optionally already hosting at least one element selected from the group consisting of the at least one light source, an electrical conductor, light exit element, and light absorption or scattering area or element. Optionally, a temporary masking element could be first provided upon or next to the at least one element or other location upon the substrate film, and, after provision of the optical cladding, removed. Still, selective and non-selective provision of the cladding could be combined. For example, some layers, or portion of a layer, thereof could be provided non-selectively and the rest selectively.

In various embodiments, the adjacent optical cladding may be provided in several steps and/or layers, preferably at least one layer thereof being provided prior to at least a portion of the transmissive element so that the transmissive element at least partially covers the underlying at least one layer on the substrate film; and/or at least one other layer of the cladding being provided subsequent to the provision of the at least portion of the transmissive element and thus located next to (on a side) and/or on top of the at least portion of the transmissive element.

The method may in some embodiments comprise providing, preferably through molding, a light blocking element from essentially opaque material at least onto first side of the substrate film, substantially adjacent, optionally next to and/or on top of, the transmissive element and/or the optical cladding. The blocking element may be configured to essentially cover the transmissive element and/or the optical cladding from selected direction(s) such as sides or top. The blocking element may thus contact the cladding but preferably the cladding still remains between the transmissive element and the blocking element at least in areas wherein the transmissive element should retain the light emitted by the light source(s) therewithin. The blocking element may have characteristics to fulfill a masking function, insulating function, structural rigidity or other structural properties enhancing function in the multilayer structure.

Yet, in various supplementary or alternative embodiments, the method may incorporate at least one action selected from the group consisting of:

provision of at least one additional film upon the substrate film or more specifically, upon the transmissive element wherein the at least one additional film optionally hosts a number of graphics, electrical conductors, electrodes, and/or electronic or other components (e.g. one or more additional light sources such as LEDs, and/or related control circuitry);

provision of at least one optical element, optionally optically substantially opaque scattering or absorption element to the substrate film, additional film or other layer of the multilayer structure, optionally incorporating removal of a temporary masking element therefrom after the provision of the cladding material that also ends up on the masking element;

provision of the optical cladding in several steps and layers optionally prior to the provision of at least portion of the transmissive element upon the substrate film and/or subsequent to the provision of the at least portion of the transmissive element;

provision of a light exit element optionally adjacent (e.g. in contact with) or at least optically connected to the optically transmissive element, e.g. at the substrate and/or additional film, or at least partially defined by it; and forming, optionally thermoforming or cold-forming, the substrate and/or additional film to exhibit a target three-dimensional shape preferably subsequent to provision of at least one element such as an electrical conductor or electronic component, such as the light source, thereon.

In various embodiments of the method, the at least one additional film may include a film provided on a side of the transmissive element that is opposite to a side facing the substrate film. The additional film may optionally host or be at least adjacent at least part of the optical cladding.

A device such as an electronic device comprising an embodiment of the multilayer structure may be provided. The device may be a portable, hand-held, wearable, desktop or other type of a device. It may be of stand-alone type, or the device may constitute a part of a larger ensemble with reference to a dashboard panel, door panel, roof panel, other panel, seat or other feature of a vehicle, for example. It may be a lighting device or implement primarily some other function, optionally for a vehicle or some other target device. Yet, an embodiment of a method in accordance with the present invention may comprise one or more phases involving installing or directly producing the multilayer structure in accordance with an embodiment of the present invention to a host device or host structure.

Different considerations presented herein concerning the embodiments of the multilayer structure may be flexibly applied to the embodiments of the method mutatis mutandis, and vice versa, as being appreciated by a skilled person.

The utility of the present invention arises from a plurality of issues depending on the embodiment.

For example, a great variety of compact, low weight, highly integrated and optically efficient lighting apparatuses and many other apparatuses, elements or structures, which still incorporate electronics and lighting related optical features, may be obtained through the utilization of a suggested multilayer construction and a related method of manufacture, still naturally depending on a particular embodiment of the multilayer structure or method considered. As the final structure may appear somewhat simple and compact by construction, such properties convert in many use scenarios into durability and other additional beneficial assets. The relative simplicity of the associated manufacturing process yields benefits own its own, with reference to e.g. rather tolerable equipment and material costs, space, process time, logistic and storage requirements as well as high overall yield.

In various embodiments, reflection such as essentially total internal reflection (TIR) style, thus optically substantially lossless, propagation of light at least at selected frequencies/wavelengths is enabled or enhanced by utilizing an embodiment of suggested optical cladding within the discussed multilayer structure e.g. at the periphery of a lightguiding function—having transmissive element. The transmissive element may, in turn, be positioned between at least one, typically embedded, light source and a destination (target) element, region or area in the structure, such as a particular exit element or other portion of the structure defining an exit area/surface towards e.g. the environment and potential user(s) of the structure residing in the environment. The cladding material is selected so as to have a low enough refractive index to ensure sufficiently low critical angle between the transmissive element and the cladding, which generally translates into an increased amount of totally internally reflected light at transmissive element→cladding direction in the concerned interface.

Yet, the use of various additional elements such as blocking elements or color-exhibiting elements (e.g. color films/coatings), which would otherwise easily cause optical losses in terms of e.g. undesired light scattering, absorption or leakage, is facilitated in the structure as the cladding may be conveniently positioned between them and the transmissive layer made of e.g. molded plastic to maintain the light more effectively within the transmissive layer. Otherwise, i.e. if there is no cladding in between, more light could escape first from the transmissive lightguiding element to the additional element and therefrom e.g. to the environment. For example, critical angles at the concerned interfaces, if existing at all (the additional element could even have a higher refractive index than the primary transmissive element), could be lower than in the case of a direct interface between the transmissive element and the environment (e.g. air). However, the leakage phenomenon may also be exploited by omitting e.g. cladding selectively from the locations via which light outcoupling from the transmissive element is desired to take place optionally e.g. through a colored or some other element. At locations wherein the transmissive element directly contacts e.g. the air present in the environment, the cladding may also be omitted as the air has a very low refractive index of one and thus works usually rather well as dynamic "cladding".

In various embodiments, the cladding may be optically substantially transparent having regard to e.g. visible light or other selected frequencies/wavelengths, or alternatively, exhibit at least one selected color. Accordingly, the cladding could have at least a limited optical masking function associated therewith, for instance.

Still, related to the introduction of described-like cladding and related increased applicability of blocking/masking elements or specifically e.g. colored elements in connection with e.g. IMSE based multilayer structures, flexible positioning of light sources is also facilitated within the structure, which further makes designing such structures generally more convenient by elevating the related degrees of design freedom. Thereby, in various embodiments the positioning of light sources such as LEDs and embedded electronics in general is relaxed having regard to the actual hosting multilayer structure and/or its environment. Desired light paths, optical efficiency and other preferred optical, if not strictly illumination related, characteristics can be obtained, not solely by the positioning and alignment of the light sources and transmissive material anymore, but further jointly by configuring the cladding as well as potential other optically functional elements such as light exit elements, absorption or scattering elements, optical microstructures, etc. as desired in the multilayer structure. The preferred illumination characteristics may include e.g. enhanced controllability over the uniformity of light at desired locations such as selected light exit surfaces of the structure. For instance, lighting uniformity may be elevated with respect to such surfaces. Yet, different highly conformal light conveying channels, established by transmissive element(s) and related cladding, for instance, may be provided in various 3D shapes, well following and adapting to the shapes of the overall multilayer structure whenever desired.

In general, through determination of various characteristics of the structure, such as cladding material, dimensions and positioning of the cladding, desired optical properties in terms of e.g. transmissivity, reflectivity, absorbance or absorption, scattering properties, etc. may be obtained and spatially flexibly while accurately controlled even locally in the structure. Accordingly, optical efficiency of the structure may be enhanced or otherwise optimized either generally or locally.

In various embodiments, a number of lighting features such as light sources and associated optics, guiding or especially light-conveying transmissive and preferably low optical loss inducing layers, cladding layers, lenses, diffusers, collimators, prisms, diffracting elements, reflectors, opaque/masking elements, etc. may be cleverly integrated into a common assembly, which may in turn establish at least part of a host device or host element. Different types of light sources in terms of e.g. output characteristics (wavelengths/frequencies, point-like source vs area light source), power consumption, dimensions, or manufacturing technology (e.g. printed and mounted) may be provided even in a common embodiment. One or more illumination effects established may have aesthetic/decorative, indicative, instructive and/or warning constituents, for example. By a proper configuration of the light sources, intermediate elements such as transmissive elements, blocking/colored elements and e.g. related exit areas or elements, the outcoupled light may appear very uniform while various masking or blocking features can still be utilized to hide the underlying electronics such as the light sources, conductors, control circuitry, or other embedded features from external viewers such as the users of the structure.

Finally, the obtained structure may, in addition to illumination aspects, exhibit a selected appearance or e.g. tactile feel to the viewer such as a human operator by a selected configuration of surface graphics, embedded graphics, surface materials with different surface profiles (look and feel), general shape, etc. The used materials may be optimized for various purposes including e.g. protective, optical, visual, adherence, durability, and electrical aspects. For instance, the material of the transmissive element optionally together with other used materials such as film materials or other layered materials may be selected so to protect the embedded elements such as electronics from various environmental conditions such as moisture, heat, cold, dirt, shocks, etc.

The expression "a number of" may herein refer to any positive integer starting from one (1).

The expression "a plurality of" may refer to any positive integer starting from two (2), respectively.

The ordinal numbers such as "first" and "second" are herein used to distinguish one element from other element, and not to specially prioritize or order them, if not otherwise explicitly stated.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

Figure 1:
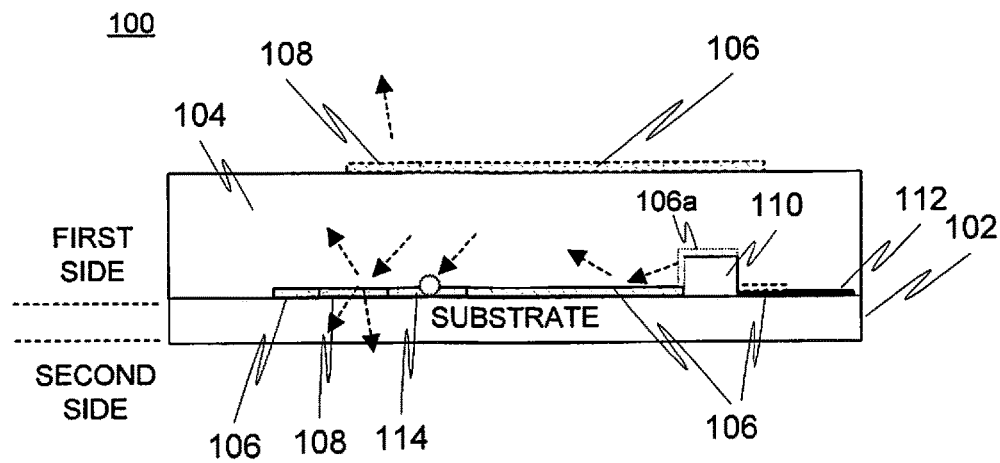
FIG. 1 illustrates one embodiment of a multilayer structure in accordance with the present invention via a related side or cross-sectional side view.

As being appreciated by a person skilled in the art, various material layers and generally elements of the present invention such as the transmissive element, cladding, film(s), absorption or scattering element (e.g. color film), light blocking element, and/or light exit element may extend, still depending on each particular embodiment, in a plurality of dimensions within and/or on the multilayer structure, i.e. an element may have substantial width, length and height, wherein the height, or 'thickness', may be measured in transverse direction relative to the plane at least locally defined by the surface of a substrate film, for instance. Yet, the width, length and height may be considered mutually perpendicular so that the individual locations of the element may be conveniently defined in three-dimensional Euclidean space by Cartesian coordinates, for example. Quite often e.g. a substrate film or a transmissive element defines substantially planar or merely mildly curved and/or elongated shapes either locally or generally, whereupon the concerned element could be generally deemed essentially two-dimensional due to a negligible height in contrast to remaining dimensions, but also other more radical, essentially three-dimensional overall shapes are feasible in the context of the present invention.

Materials of various elements described herein, such as of the ones discussed above, may have different properties as they may be flexible, elastic, stiff or rigid, for instance, whereupon the resulting elements and the multilayer structure as a whole may also exhibit such properties at least locally if not generally.

In various embodiments of the present invention, one or more materials of the film(s), which may optionally serve as substrates for various electronics such as light sources, control and/or sensing (e.g. touch or environment sensing) circuitry, and/or for other elements such as discussed various optical elements, may comprise at least one material selected from the group consisting of: polymer, thermoplastic material, organic material, elastomeric material, electrically insulating material, PMMA (Polymethyl methacrylate), Poly Carbonate (PC), polyimide, a copolymer of Methyl Methacrylate and Styrene (MS resin), glass, organic material, fibrous material, Polyethylene Terephthalate (PET), metal, wood, solid wood, veneer, plywood, bark, tree bark, birch bark, cork, natural leather, natural textile or fabric material, textile material, cotton, wool, linen, silk, formable material, thermoformable material, and cold-formable material.

In various embodiments, one or more materials of the optically transmissive element, optical cladding, an optical exit element, and/or an optical blocking element included in the structure may in turn comprise e.g. at least one material selected from the group consisting of: polymer, thermoplastic material, elastomeric material, electrically insulating material, PC, PMMA, ABS, PET, nylon (PA, polyamide), polypropylene (PP), polystyrene (GPPS), and MS resin.

In various embodiments, the multilayer structure may be provided, in addition to e.g. a number of light sources and related electrical conductors such as additively printed traces and/or contact pads, at least one further electrical or electronic element including at least one element selected from the group consisting of: integrated circuit, processing unit, memory, communication unit, transceiver, transmitter, receiver, signal processor, microcontroller, battery, light sensing device, photodiode, connector, electrical connector, optical connector, power connector, diode, printed electronic component, sensor, force sensor, touch sensor, proximity sensor, antenna, inertial sensor, accelerometer, gyroscope, capacitive switch or sensor, inductive sensor, user interface element, vibration element, electrode, sensor electrode, printed sensor electrode, wireless tag, electronic sub-assembly and photovoltaic cell. The elements may be originally provided to one or more films of the structure, for instance.

Generally, in various embodiments power supply to any element such as light source(s) or control/processing devices hosted by the multilayer structure may be at least partially arranged by an included battery or other locally provided power source. Yet, to arrange suitable power to a number of electrical or specifically electronic elements included in the multilayer structure from the source, a specific power circuitry including e.g. a number of converter(s) may be utilized. A number of electrical conductors may be harnessed into power transfer as well as communication purposes between different elements.

Alternatively or additionally, power connection and/or communication connection may be arranged to the multilayer structure via at least one connecting element, such as an electrical (contact-based) connector, being preferably located at or at least functionally reachable via the surface of the structure by e.g. a compatible external connector of an external device or external system such as of a host device of the multilayer structure, and/or by wireless or contactless connecting arrangement such as a number of inductive or capacitive connecting element(s) provided in the form of e.g. conductive loops or specifically coils.

With particular reference to the attached figures, FIG. 1 illustrates at 100 one embodiment of a multilayer structure or multilayer assembly in accordance with the present invention.

The depicted, still merely exemplary, structure 100 is shown to exhibit a rather flat general shape in favor of clarity. However, as contemplated above a person skilled in the art shall appreciate the fact the optimum shape may be determined case-specifically based on e.g. optical, structural, dimensional and aesthetic design objectives. Accordingly, the resulting overall shape and/or constituent shapes of the included elements could also be more radically three-dimensional, incorporating e.g. curved or angular portions at least locally, in addition to or instead of substantially planar surfaces. Yet, a finer scale surface texture of the structure 100 may be constant or spatially vary. The texture may contain e.g. flat and/or grainy portions due to e.g. materials used or surface type microstructures such as optical microstructures provided to the surface layer.

The structure 100 is provided with at least one substrate 102 of preferably film, or 'foil', type thus typically having a considerable width and/or length in contrast to thickness (vertical direction in the fig). The substrate film 102 may contain e.g. plastic, optionally thermoplastic, material. The substrate film 102 may be at least in places if not fully electrically substantially insulating. The substrate film 102 may be flexible, e.g. bendable, so that it may conform to and exhibit different target shapes such as curved shapes, at least locally if not generally, without breakage also in the final structure 100. Yet, the film 102 may be elastic.

In some embodiments, the structure 100 may establish a complete functional ensemble of its own, whereas in some other embodiments the structure 100 may be physically and/or operatively (in terms of e.g. potentially wireless communication and/or power transfer) connected to another structure such as a host device.

The substrate film 102 accommodates at least on one side (named as 'first' in the fig.) and respective surface thereof, electronics including at least one light source 110 such as LED as discussed hereinbefore. Yet, the substrate film 102 may be configured to host, either on the same or opposite ('second') side, a number of further electrical or specifically electronic elements, and/or elements of different nature, such as optical elements.

In some embodiments, the opposite, second side of the film 102 may define at least part of the exterior of the structure, but it may also be covered by a number of further elements or layers. Yet, in some embodiments the multilayer structure 100 may be attached to a host structure via the film 102. For instance, the second side of the film 102 could be utilized as a contact side, or specifically, as a contact surface hosting or receiving a number of specific connecting elements such as rivets, screws, adhesive, pins, nails, bosses, boss-bases, or their counterparts. Alternatively or additionally, in the depicted example essentially any of the side walls (shown as vertical) of the structure 100 or e.g. the top surface on the opposite side of an optically transmissive element 104 relative to the film 102 could be similarly applied for fixing the structure.

A number of electrical conductors 112, or 'wiring', may have been provided to supply the electronics such as light source(s) 110 with power from an internal or external power source as discussed hereinbefore. Yet, there may be conductors 112 for conveying signals (e.g. control signals and/or (other) data) between different elements of the on-board electronics, i.e. electronics included in the structure 100, and/or between the electronics included in the structure 100 and an external device or structure. Same conductors 112 may be even used jointly for power and data communication.

Optical cladding 106 may have been arranged on the substrate film 102 to cooperate with the optically transmissive element 104, wherein the transmissive element 104 preferably comprises e.g. thermoplastic material as contemplated hereinelsewhere.

The transmissive element 104 is configured to convey light emitted by the at least one light source 110 and therefore has, for such purpose, suitable transmission characteristics such as transmittance in the wavelengths/frequencies of interest, optionally including or limiting to visible light and/or other selected wavelengths emitted by the light source 110. The element 104 may be thus considered to functionally establish a transmissive core of a lightguide or lightguiding structure, which may further be called as a light channel. The shape of the element 104 may be selected use case specifically and e.g. from the standpoint of used manufacturing technology such as injection molding. In some embodiments the transmissive element 104 could refer to a multi-part element optionally comprising several physically non-connected (but potentially still e.g optically connected) transmissive (sub-)elements. The sub-elements or e.g. protrusions or other portions of an essentially integral or monolithic transmissive element 104 could, on the other hand, be configured to establish a plurality of light channels within the multilayer structure.

In various embodiments, cladding 106 may comprise one or more mutually connected and/or unconnected cladding elements or portions such as layers optionally spatially, either essentially in-plane and/or three-dimensionally, distributed at selected locations within the structure 100. Thereupon, the cladding 106 may have been provided so as to establish several constituent layers preferably having at least a portion of the optically transmissive element 104 in between at least locally. Two or more of such layers may optionally extend at least locally essentially parallel to the surface and/or transverse directions of the substrate film 102.

Accordingly, instead of or in addition to the cladding 106 located upon the substrate film 102, a portion of the cladding 106 could be provided elsewhere, such as on the opposite side of the transmissive element 104 relative to the substrate film 102 or light source 110, which is indicated in FIG. 1 by depicting cladding element 106 on top of the shown structure using broken lines. As being deliberated hereinelsewhere in more detail, also the opposite side of the transmissive element 104 may optionally contain a film that may be configured to first receive or at least later neighbor at least portion such as a layer of the cladding 106. However, such additional film is not necessary for providing cladding 106 on the opposite side of the element 104 as the cladding 106 could be just printed, sprayed or e.g. transfer laminated on the element 104.

In some embodiments, cladding material 106 may be arranged on the substrate film 102 that already accommodates electronics such as a light source 110, whereupon the light source 110 may be at least partially covered by the cladding material from the side and/or top directions, which is shown at 106*a*. In this kind of a scenario, at least the light emission surfaces of the source 110 (the source may be of side emitting or top emitting type, for example) may be cleared afterwards e.g. mechanically or chemically, protected by temporary masking during the provision of the cladding 106, or the material and general configuration of the cladding 106 covering the source 110 may be just selected such that the light output by the source 110 still reaches the transmissive element 102 to a desired extent even after provisioning of the cladding 106. For example, the materials and geometry at source 110—cladding 106 interface may be selected so that the light is not reflected back to the source 110 nor attenuated in the cladding 106 too much while proceeding into the transmissive element 104 from the source 110. For example, refractive index of the optics of a light source 110 may be selected lower than the one of the cladding 106, or the optics may be adjusted such that that the emitted light is incident on the surface of the cladding 106 with incident angle(s) smaller than the concerned critical angle, e.g. near zero angle of incidence (relative to surface normal).

Generally, the desired total transmission at the wavelengths of interest may naturally vary depending on a particular embodiment to be implemented but generally, the plastic material used to establish e.g. the transmissive element 104 comprises optically substantially transparent or translucent material having regard to selected frequencies or wavelengths thus enabling the frequencies/wavelengths to pass through it with low enough loss. Sufficient total transmission of the element 104 at the relevant wavelengths may thus vary depending on the embodiment, but may be about 50%, 60%, 70%, 75%, 85%, 90% or 95% or higher, for example.

The structure 100 is preferably configured so as to at least locally effectuate internal reflection, preferably essentially total internal reflection, based propagation of light emitted by the at least one light source 110 within the transmissive element 104. The element 104 thus preferably comprises material(s) having a higher refractive index than the adjacent cladding 106. Potentially through finer adjustments of associated material properties, such as concentration of constituent substances, in terms of e.g. refractive indexes light propagation including reflection vs. outcoupling ratio may be spatially selectively controlled within the structure and even within a single element. A larger difference in the refractive indexes of the interfacing materials of the transmissive element 104 and the cladding 106 at an inspected location may convert into an increased amount of reflected light at that location due to a lowered critical angle, and vice versa. Accordingly, both overall and local adjustments in the light reflection and transmission properties at the transmissive element→cladding interface could be effectuated by altering the material of the transmissive element, material of the cladding, and/or through omission of cladding, for instance.

Preferably, the refractive index of at least the primary material of the cladding 106 is about 1.4 or less. If the transmissive element 104 comprises essentially e.g. PMMA or PC, the refractive index of the element 104 is thus about 1.48 or 1.55, respectively.

Preferably, the thickness of the cladding 106 is at least in places selected to be sufficient to allow or enhance TIR based propagation of light within the neighbouring transmissive element 104. As one generally applicable rule of thumb, the thickness could roughly be at least about double the wavelength of TIR propagating light in the element 104. When visible light is considered, such minimum thickness could be about 1.5 um. This is to avoid e.g. possible evanescent wave coupling (frustrated TIR) through the cladding 106.

In the light of the foregoing, the mutual locations, dimensions and shapes or geometries of the transmissive element 104, the light source(s) 110, such as top or side emitting LEDs, and the cladding 106 may be configured such that the light emitted by the source(s) 110 arrives (at least to a degree considered sufficient), after propagating within the transmissive element 104, at selected material interfaces such as 104-106 interface with angles greater than a related critical angle to ensure internal reflection and thus continued propagation of the light incident at the interface within the transmissive element 104 instead of proceeding into neighbouring material, naturally excluding one or more potential special locations wherein alternative phenomenon such as light outcoupling, transmission, absorption, and/or scattering is desired and designed to take place and thus desired at least to a limited degree. It may be still preferable that e.g. a minor portion of light arriving even at such special location continues propagation, due to partial reflection, within the transmissive element 104 until a next special location confronted, for example.

In some embodiments, the transmissive element 104 and at least one further element, such as the substrate film 102, are configured to have substantially similar optical properties in terms of e.g. refractive index at least locally. The interface between the two may be then considered transparent or substantially non-existing relative to the incident light and e.g. total internal reflection based propagation thereof within the then functional aggregate type of a light-guide establishing combination of the concerned elements. In addition to or instead of the substrate film 102, the at least one further element may comprise other element(s) such as an additional film that may be comprised in the structure as well.

The multilayer structure 100 may indeed generally comprise a number of various additional elements such as (color) films and/or (substrate) films, (color) printed layers or other material layers e.g. adjacent the cladding, which may refer to being next to the cladding 106 in common plane therewith while also being in contact with the transmissive element 104, or being masked by/behind the intermediate cladding 106 from the standpoint of the transmissive element 104, for instance. As alluded to hereinbefore, such additional elements may have properties such as refractive index that might cause more light to exit the transmissive element 104 if provided in direct contact with the element 104 instead of the cladding 106.

For example, item 108 refers to a light exit element that is preferably located adjacent, optionally in contact with, the transmissive element 104 to facilitate light outcoupling therefrom. The light exit element 108 may be configured to pass incident light through for outcoupling purposes and/or reflect the light in a manner, e.g. with selected angle(s), so that the light will more easily exit the transmissive element 104 when next time reaching the periphery thereof, e.g.

element 104→cladding 106 interface. Yet, a light exit element 108 may be configured so as to facilitate partial outcoupling and partial continued transmission (within element 104) of the incident light.

The light exit element 108 may thus comprise e.g. at least one element selected from the group consisting of: through-hole defined in and by the material of the optical cladding to enable the conveyed light incident thereon to pass therethrough, surface relief structure, grating structure, prism structure, cladding free area or volume between the substrate film and the optically transmissive element the conveyed light is incident on, refractive outcoupling element, diffractive outcoupling element, outcoupling element comprising optically substantially transmissive, optionally translucent or substantially transparent, material having regard to the frequency or frequency band, optically transmissive material exhibiting selected one or more colors, reflective element, and outcoupling element comprising optically transmissive material with refractive index equal to or higher than the first refractive index.

As indicated in the figure, a number of light exit elements 108 may be provided at desired locations of the common multilayer structure 100, e.g. on any or both sides of the transmissive element 104.

In some embodiments, the spatial distribution and/or other characteristics of light exit elements 108 and/or other optically functional/meaningful elements (e.g. elements 106, 114, 116) could be configured dependent on a reference such as a light source 110 or specifically, a distance thereto.

For example, if lighting uniformity is desired in the outcoupled light over an exit surface, the efficiency and/or frequency of light exit elements may be increased (i.e. mutual distance, a so-called pitch, reduced between neighbouring exit elements) together with the increasing distance to the light source 110, to compensate losses and generally reduced light reaching the areas farther away from the light source 110. The uniformity may be initially simulated during a design phase using applicable commonly available or proprietary optical simulation tools and later measured in prototyping phase over a target area.

One way to determine uniformity is to determine the ratio between minimum and maximum luminances over the target area. Naturally still depending on the used materials, dimensions, light sources 110, etc., through dense enough and potentially adaptive positioning of light sources 110 and application of cladding 106 as suggested herein, relatively high uniformity values may be quite conveniently achieved, optionally supplemented by a clever use of further features such as light exit elements 108 as contemplated above. By the adoption of cladding 106, various requirements relating to other aspects, such as the pitch, of light sources 110 may on the other hand be loosened, which may be particularly beneficial e.g. in use scenarios where space and/or power consumption of electronics including light sources 110 is to be minimized.

Item 114 refers to a light absorption or scattering element (naturally the same element may be capable of both absorption and scattering). The element 114 may optionally be translucent or substantially opaque having regard to selected wavelengths/frequencies, such as the ones of visible light and/or emitted by the light source(s) 110, for instance, if different from visible light. Accordingly, the element 114 may exhibit at least one selected color, optionally provided by color pigment, color dye, color coating or color film comprised in the element.

In various embodiments, several structurally and/or functionally different elements such as any of elements 106, 108, and 114 may be flexibly positioned so as to selectively alternate, for instance, according to a desired positioning scheme, e.g. in a direction parallel to the average or general propagation direction of light conveyed within the transmissive element 104 (that being essentially a horizontal direction in the illustrated scenario), and/or in transverse direction thereto. This may be done to control light distribution inside the structure 100 and especially within the transmissive element 104, and/or to control related light outcoupling, masking and/or attenuation characteristics.

Various general principles already set forth hereinbefore in relation to FIG. 1 or without explicit reference to any figure appended herewith, regarding e.g. included elements, their functionalities, materials, other properties as well as their mutual configurations within the structure, are selectively adoptable and applicable basically in any embodiment of the present invention as being easily understood by a skilled person, for which reason they are not unnecessarily repeated below in connection with the description of the remaining figures. Likewise, additional features disclosed for the first time below in connection with the description of any remaining figure can be flexibly adopted in other illustrated or merely textually described embodiments unless explicitly stated to the contrary.

Figure 2:
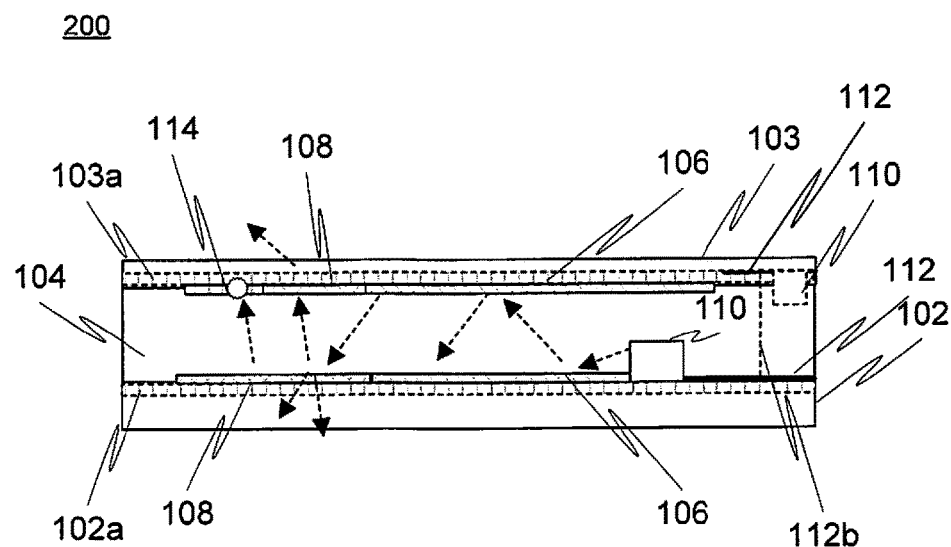
FIG. 2 illustrates a variation of the embodiment of FIG. 1.

FIG. 2 illustrates at 200 a variation of the embodiment, of FIG. 1, wherein an additional film 103 has been provided on the other, opposite side of the transmissive element 104 relative the substrate film 102. What has been already said about film 102 is generally applicable also to film 103 having regard to e.g. properties, materials, functions, dimensions, hosted elements, etc. thereof. The films 102, 103 may be mutually substantially identical, generally similar or essentially different in terms of used materials, dimensions, functionalities and/or hosted elements, for example.

The film 103 may have a characterizing function as such and/or it may act as a substrate for a number of other elements with desired functionalities. The film 103 or an element such as conductive trace, optical element or electronic component such as a light source 110 provided thereto may be connected to the film 102, or an element thereon, by a dedicated connecting member 112b such as a pin, rod, printed material, (filled) hole, wiring, etc. The member 112b may comprise e.g. electrically or optically conductive material for providing electrical or optical connection, respectively. In some embodiments, the films 102, 103 could even be established by a common film that has been bent essentially 180 degrees at the edge of the structure 200. The edge, thus defining a central portion of the common film, could be used to connect the films 102, 103 defined by the opposite ends of the common film.

In various embodiments, the film 103 may cover or host at least part of the cladding 106, which is explicitly shown in the figure. Yet, as being further illustrated, there may be a number of intermediate elements, such as layers, optionally including e.g. absorptive or scattering layer 103a and/or other absorptive or scattering element 104.

In addition or alternatively, at least one absorptive and/or scattering element 102a, 114 such as a layer 102a could be provided to, or at least closer to, the substrate film 102 e.g. as a coating.

This particular and other implementations of the multilayer structure generally considered herein preferably include one or more light output or exit surfaces as being further visualized in the figs. In the examples of FIGS. 1-2, light explicitly is shown to exit the structure via both top and bottom surfaces, while there may even be additional or alternative light exit surface(s) or areas e.g. at either side (in this example, basically vertical walls) of the multilayer structure. An exit surface may be located on the same side of the structure 200 as a corresponding light source 110 relative to the transmissive element 102 (i.e. side of the film 102), and/or on the opposite side (i.e. side of a potential film 103). To facilitate and enhance light outcoupling via a selected light exit surface, a number of light exit elements 108 as described herein may have been positioned adjacent, e.g. in contact with, the transmissive element 104.

Figure 3:
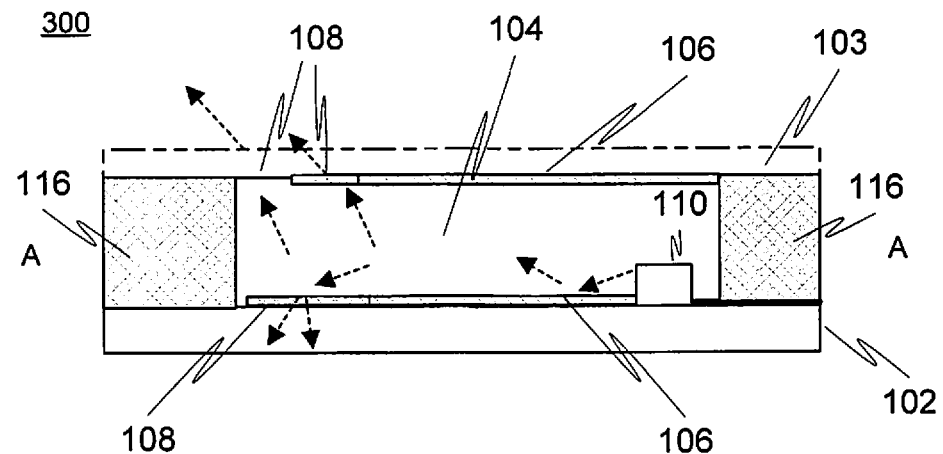
FIG. 3 illustrates a further variation.

FIG. 3 illustrates, at 300, a further variation of the embodiment of previous figs. In this example, at least one preferably substantially opaque blocking element 116 has been provided, optionally directly established by molding of suitable plastic material, onto the substrate film 102, e.g. between the film 102 and potential additional film 103. The blocking element(s) 116 may have been configured so as to define a number of optically essentially non-transmissive support structures such as at least part of the inner and/or outer walls for one or more light channels, the core of which the transmissive element 104 typically establishes and e.g. cladding 106 at least in places separates from the blocking element(s) 116 due to being provided in between.

Figure 4:
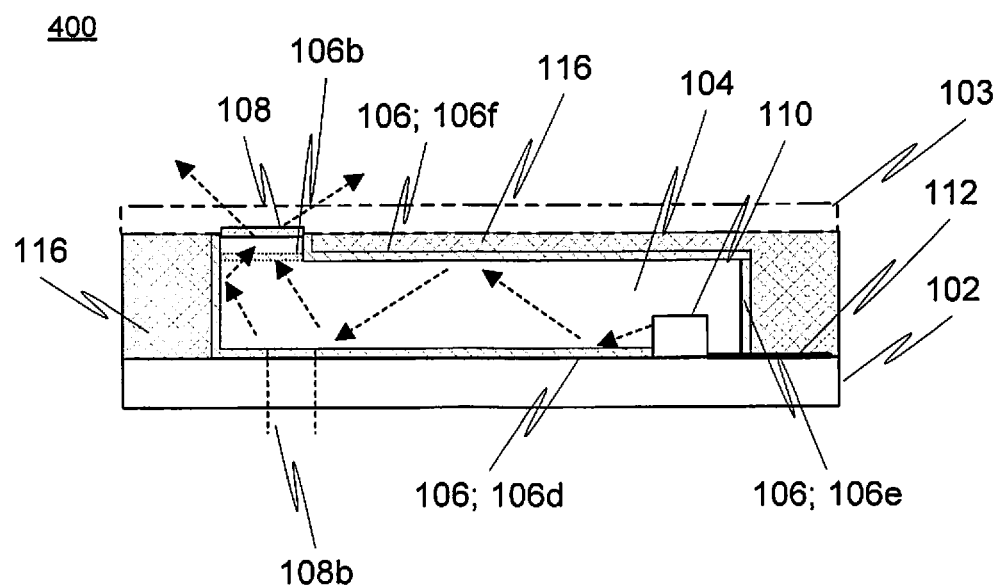
FIG. 4 illustrates still a further variation.

FIG. 4 illustrates, at 400, still a further variation of the embodiment of previous figs. Here the preferably optically substantially opaque blocking material of the blocking element(s) 116 has been provided to additionally cover the transmissive element 104 and cladding 106 from above ('above' in the meaning of the orientation of the figure; a skilled person shall realize that this and other discussed embodiments of the present invention may find applicable use in various fixed or dynamic orientations, which may or may not follow the orientation of the multilayer structure as indicated in the appended figures) and from the sides (vertical portions/layers) through molding, for instance. Thus the blocking element(s) 116 may be configured so as to embed the transmissive element 104 essentially therewithin on the substrate 102. Yet, cladding 106 has been essentially configured between the transmissive element 104 and the blocking element(s) 116 to prevent undesired light leakage into the blocking element 116 from within the transmissive element 104, for instance.

In various embodiments of the multilayer structure, including but not limiting to the one shown in FIG. 4, the cladding 106 may establish at least one, neighbouring and preferably also physically contacting, potentially conforming, layer for the transmissive element 104 in any direction relative thereto.

For example, at least portion of the cladding 106 may be arranged below 106d the element 104, being thus closer to and potentially conforming to the shape of the substrate film 102, which may further act as a substrate for the cladding 106 during manufacturing.

Additionally or alternatively, at least portion of the cladding 106 may be arranged on a side 106e of the element 104 so that it is next to the element 104 and potentially substantially perpendicular to the film 102 and/or parallel to the side surface of the element 104.

Additionally or alternatively, at least portion of the cladding 106 may be arranged on top 106f of the element 104.

In the shown scenario, the light exit element 108 has been provided, optionally by just locally omitting cladding material and/or by actual addition of a particular light exit element, at the opposite far-end corner of the transmissive element 104 relative to the light source 110, but a skilled person may appreciate the fact that additional or alternative light exit element 108 and related exit surface could be easily provided elsewhere in the structure 400 as well, with reference to e.g. broken line—depicted area 108b on the same side of the transmissive element 104 as the light source 110 and the substrate film 102; in this scenario the cladding 106 and/or blocking element 116 could establish a substantially continuous protective cap or shell structure upon the transmissive element 104 and the embedded light source 110. A "patched" area in the topmost layer of the cladding 106 has been illustrated at 106b with broken lines, indicative of the fact that there does not have to be any opening in the top cladding 106 or blocking element 116 especially in the latter scenario described above.

Based on the foregoing, it becomes clear to a skilled person that optically very efficient, more or less selectively masked lightguiding structures may be integrated with IMSE electronics and similar multilayered constructions by different embodiments of the present invention.

In various embodiments, the light exit element(s) 108 and/or further elements such as any of films 102, 103 may be configured so as to generally or locally define a shape of a selected graphical pattern, touch-sensitive area (when e.g. the embedded electronics 110, 112 comprise touch-sensing circuitry such as inductive or capacitive touch sensing circuitry), visual status indicator area (e.g. round, rectangular or more complex area to be optionally selectively illuminated e.g. through selective control of light source(s) 110 to reflect e.g. a selected status of the overall multilayer structure, its selected component or e.g. host structure/device), picture, number, letter, text, alphanumeric code, etc. so that the shape can be illuminated by the light emitted by the light source(s) 110 and outcoupled from the structure 100. The shape may be jointly defined by a proper mutual positioning of e.g. light blocking and transmissive material as being appreciated by a skilled person.

Having regard to the illumination features of different embodiments of the multilayer structure contemplated herein, one also previously mentioned general objective may be in providing uniform lighting, or uniform 'brightness' distribution, via the selected exit surface(s) towards the environment, thus avoiding excessive hotspots. The directivity of the light (is it e.g. more collimated or diffuse) may be determined case-specifically as well. For example, diffusing or collimating lenses, microprisms, microgratings, implemented e.g. by surface and/or embedded (cavity) optics such as reliefs may be provided in the light exit elements and/or other remaining features such as films, transmissive element or the cladding, via which the light previously conveyed within the transmissive element 104 reaches or at least approaches the environment.

In addition to the light projected or emitted by the multilayer structure from therewithin, perceived uniformity of surface illumination may also depend on the uniformity of the reflected external light. Accordingly, in some embodiments, the outer (exterior) layer of the multilayer structure may be provided at least locally, such as at the selected light exit locations, diffusive surface to reflect incident external light equally in every direction. This kind of diffusion property may be achieved by elevating surface roughness, for example.

Figure 6:
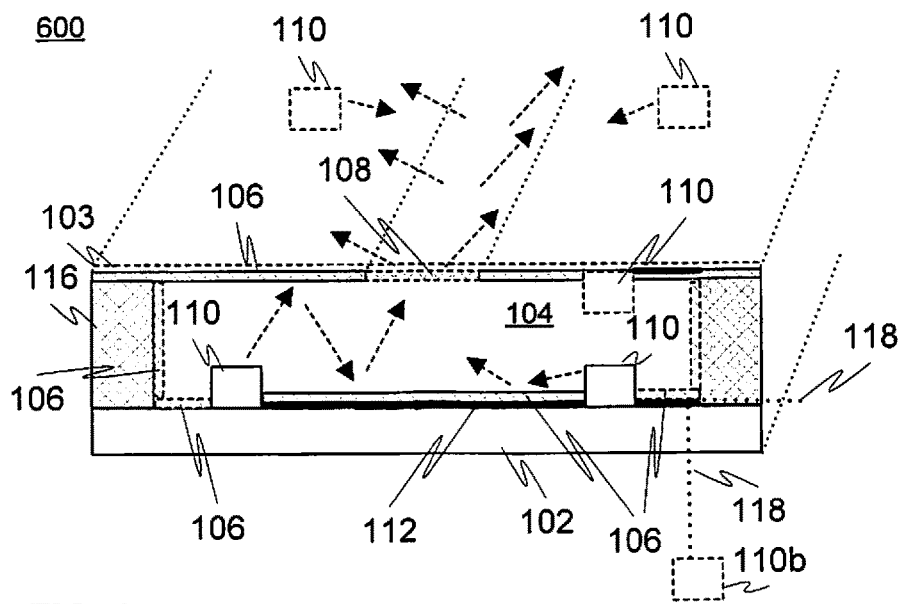
FIG. 6 illustrates a use scenario of the multilayer structure in accordance with an embodiment of the present invention, which may flexibly and selectively adopt features e.g. from any of FIGS. 1-4.

FIG. 6 illustrates a use scenario of a multilayer structure 600 in accordance with an embodiment of the present invention, which may flexibly and selectively incorporate various features e.g. from the solutions of any of FIGS. 1-4.

In this roughly axonometric type of a partial sketch of the structure 600 contoured by the help of broken lines, the light exit element 108 defines an elongated, externally perceivable light stripe in the overall structure. In other embodiments, the light exit element 108 could naturally define some other shapes. The shape defined by the element 108 may have indicative, decorative and/or illumination function among others, for instance. In case the element 108 does not extend to the actual surface of the overall structure 600, the surface layer such as an additional film 103 shall be at least locally provided with transmissive material enabling the light to pass through it with sufficient transmission.

Cladding 106 has been provided in the particular example of the figure on various surfaces of the transmissive element 104, i.e. of a light channel core. There is cladding between the transmissive element and the substrate film as well as on the opposite side of the transmissive element 104, i.e. closer to a depicted exit element 108. Alternatively or additionally, there could be cladding on any of the side walls (vertical in the figure) of the transmissive element 104 as being illustrated using broken lines, just to highlight the great variety of different options the present invention offers to a product designer in terms of enabling confining the light more or less selectively within the transmissive medium of element 104 while its journey from the light source(s) 110 to selected exit areas on the surfaces of the element 104 and of the multilayer structure in general.

The exit element 108 may be at least intermittently, e.g. in a pulsed manner, if not continuously lit by a number of light sources 110 when the structure 600 is powered. The sources 110 may be controlled or served by applicable control and/or power circuitry 110*b*, which may be at least partially located within and/or external to the structure 600. The circuitry 110*b* is shown external in the figure in favor of clarity, but it could indeed at least partially be internal and located e.g. on the substrate film 102 or additional film 103.

The light sources 110 may have been positioned, not necessarily directly under the light exit element 108 to reduce zero path emission to the environment in favor of reduced hot spots, but e.g. next to it 108 on the substrate film 102 and/or on the potential additional film 103, which is the scenario explicitly illustrated in the figure.

Items 118 indicate possible connecting elements such as electrical wiring, connector(s), cabling, pins, contact pads, wireless connecting element(s), etc. that supply power and/or control or other data signals between the structure 600 and an external structure or device e.g. in a direction from the external device to the structure 600 but potentially additionally in reverse direction when e.g. control input, acknowledgement data, sensor data or other data is obtained by the multilayer structure and considered worth transferring to the external device, naturally depending on a particular embodiment and use case of the present invention.

As depicted in the figure, multiple light sources 110 may be arranged in a selected configuration such as a row or matrix configuration (row-column arrangement) on suitable one or more carriers such as any of the films 102 and 103.

In some embodiments, the very same integral multilayer structure 600 could naturally contain a plurality of light channels of e.g. roughly the shown nature, the cores of which established by the transmissive element 104 and separated by the cladding 106 and optional intermediate blocking element(s) 116, for instance.

Figure 7:
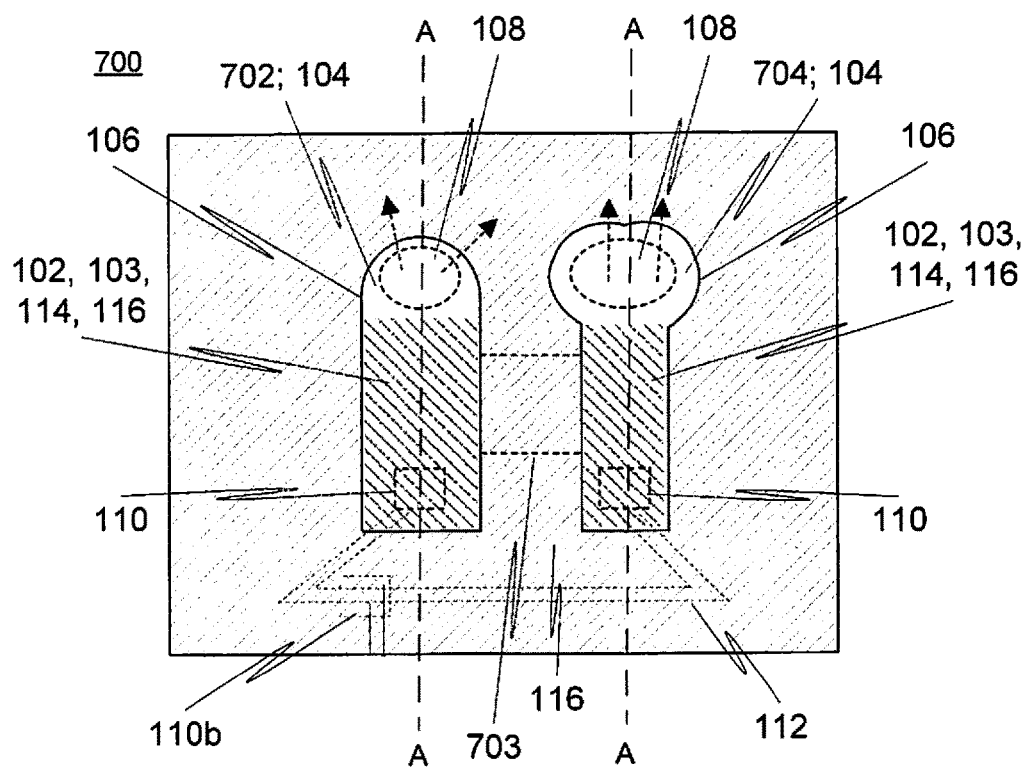
FIG. 7 depicts, via a pseudo-planar view, an embodiment of a multilayer structure in accordance with the present invention incorporating multiple light channels.

FIG. 7 depicts, at 700, an embodiment of a multilayer structure in accordance with the present invention, incorporating multiple light channels 702, 704. The depicted view may either directly or with some modifications apply e.g. to scenarios of aforediscussed FIGS. 1-4 as being easily comprehended by a skilled person. The view can be considered to represent e.g. a top or bottom view, a related cross-sectional view taken at a selected slice depth when proceeding into the structure starting from a selected surface such as top or bottom surface thereof, or a selective see-through view, i.e. the elements depicted may in a real-life implementation be located at different levels and span different lengths in a direction essentially extending perpendicularly towards/away from the plane of the figure, which could correspond e.g. to a thickness direction of the implemented structure. Yet, both the absolute and mutual positioning as well as the applied shapes and dimensions of the illustrated elements are merely exemplary also in relation to the depicted plane but still represent one feasible option. To facilitate understanding of potential relationships and alignment between the representations of the previous figs and FIG. 7, 'A' symbols provided on the sides in FIG. 3 have been further illustrated in FIG. 7 and connected by a broken line.

As contemplated hereinbefore, there may be one or more films or substrate films 102, 103 included in the structure 700. Any of the films 102, 103 may be provided with a number of light sources 110 thereon.

The light channels 702, 704, both exhibiting generally elongated while still mutually partially different shapes, are configured as essentially parallel and somewhat closely positioned in the example of FIG. 7, but in other embodiments the number of light channels, their shapes, dimensions, absolute or mutual positioning, and/or alignment could naturally be different.

Any of the light channels 702, 704 could have a shape with a substantially regular cross-section, considering e.g. channel 702, wherein only far-end/outcoupling end is slightly tapered or 'rounded'. Alternatively, the shape could be, at least in places, more irregular such as more or less constantly changing in terms of e.g. the cross-section. For example, the shape could remind of a funnel in a sense that the volume immediately surrounding or neighbouring the light source 110 is smaller and then expands towards the light exit area/element 108. This kind of a spatially either continuously or step-wise expanding channel shape has been roughly adopted in the depicted channel 704 and particularly, in the upper half thereof; an initially narrower shape evolves into a wider, more spacious and larger outcoupling end. However, substantially inverse (i.e. the volume of a light channel generally reduces with increasing distance from a concerned light source), combined (narrower section(s) in between wider or larger sections), or other shapes are feasible as well.

A light channel 702, 704 as considered herein may be generally defined by a number of elements.

A transmissive element 104 of the multilayer structure 700 may be an integral or essentially monolithic piece of optically transmissive material, or as shown in FIG. 7, the element 104 may comprise multiple transmissive (sub-)elements that are at least physically if not optically separated from each other, which has been discussed also hereinearlier. On the other hand, even an integral piece of transmissive material defining the transmissive element 104 could in various embodiments establish a plurality of light channels 702, 704 between which there thus remained at least one connective portion as being indicated at 703 in the figure as an alternative to utilization of fully separate transmissive (sub-)elements. Thus the transmissive element 104 could contain e.g. a common body portion 703 whereto a number of optionally but not necessarily parallel protrusions defining light channels integrally connect. Two or more light channels 702, 704 could also be optically connected via the body in terms of light emitted by the light source(s) 110, depending on e.g. dimensions and mutual configuration such as positioning and alignment of the source(s) 110 and the element 104.

Yet, any of the light channels 702, 704 could be associated with multiple light sources 110 instead of only one, the latter option however being the situation shown in the figure in favor of clarity. The sources 110 could be mutually aligned as desired. Two or more of sources 110 could be provided as opposing each other or generally positioned in opposing carrier surfaces such as films 102, 103, and/or positioned in a row, matrix, circular, or other selected formation, either having regard to a certain channel or generally.

Further, in the shown scenario, each channel 702, 704 basically has a dedicated (exclusive) light source 110 but in other scenarios light emitted by a single light source 110 could be spread, optionally by means of embedded spreading optics such as a number of lenses, reflectors and/or suitable optical microstructures, into several light channels 702, 704.

In preferred embodiments, the transmissive element 104 defines a transmissive core of at least one light channel 702, 704, wherein the light essentially propagates in a confined, at least to a selected extent, fashion between the light source 110 and a potential exit area/element 108 or other predetermined destination.

Cladding 106 may be provided to neighbor, surround and cover the transmissive material of the transmissive element 104 e.g. at a periphery thereof to define a shell and/or wall structure therefor at least in places, i.e. selectively, or substantially everywhere still potentially excluding a number of selected exit areas or elements 108.

The cladding material may have been generally provided in one or more layers and orientations. It 106 may be configured to at least partially cover the transmissive material of the transmissive element 104 in one or few directions only, or it may cover the element 104 from basically each direction at least locally. The cladding 106 may thus comprise a number of substantially planar or straight portions (e.g. coatings on a planar or formed film, on a transmissive element or on a component) and/or rounded (e.g. circular or tubular) or even angular (e.g. rectangular or cuboidal) portions, which applies to the shapes of the transmissive element 104 and channels 702, 704 also in general.

The cladding 106 may thus establish at least one, neighbouring and preferably also physically contacting, layer for the transmissive element 104 in any direction relative thereto, e.g. below the element 104 (e.g. close to or contacting the substrate film 102), on a side thereof (next to the element 104 e.g. perpendicular to the film 102 and/or parallel to the side surface of the element 104) and/or on top of the element 104. This was further illustrated in previously reviewed FIG. 4.

Light exit element 108 is or at least defines a light exit area preferably free of e.g. optical cladding 106 or masking that would prevent or reduce light outcoupling through it. The exit element 108 may contain a number of outcoupling enhancing and/or controlling features such as optical microstructures, lenses, etc. as contemplated hereinelsewhere. The features may be embedded and/or located on the surface of the element 108 and optionally of the whole multilayer structure 700.

Masking feature(s) for optically isolating e.g. at least part of the light channels 702, 704 from the environment and/or from each other may comprise or consist of a variety of elements included in the structure 700. In the shown scenario, areas such as portions of the transmissive element 104 close to light sources 110 are masked relative to the environment of the structure 700, while the selected exit (outcoupling) areas or elements 108 at the remote end have been left unmasked preferably so that there remains a sufficiently lossless optical path between the transmissive element 104 and the surface of the structure directly interfacing with the environment, such as air/atmosphere or and external device with which the structure 700 may be optically connected.

A number of desired masking features may be implemented by one or more film(s) 102, 103, when at least partially comprised of applicable masking material, and/or a number of other features 114 potentially still hosted by or at least connecting to the film(s) 102,103.

Further, masking may be effectuated by a number of blocking elements 116 with further reference to e.g. FIG. 4 wherein blocking element 116 covers the transmissive element 104 and cladding 106 from different directions, still advantageously leaving a number of selected areas 108, 108b unoccupied to enable controlled outcoupling of light therethrough. Thus, the blocking element(s) 116 may be generally used e.g. as optically insulative fill or wall material between channels 702, 704, while they 116 may be also configured to insulate desired parts such as the channels 702, 704 from the environment of the structure 700. The blocking element(s) 116 may exhibit selected one or more colors. They 116 may further provide structural rigidity and/or various additional insulative properties (hermetic sealing, etc.) to the structure 700.

The materials used in masking may be substantially opaque (i.e. non-transmissive) or at least translucent. The masking material may thus include colored material or specifically e.g. a (color) coating or other optical masking capable layer with reference to previously discussed items 102a, 103a, for example. Generally, the masking material may be optically reflective, absortive and/or scattering.

Masking of different light channels 702, 704 could rely upon mutually different masking elements in addition to or instead of similar or even joint elements.

In the shown example, light outcoupled at 704 is more collimated than the more diffuse or non-directional light outcoupled at 702.

Overall characteristics of the outcoupled light exiting the structure 700 and perceivable in the environment may be due to a variety of factors affecting the associated optical path starting from the light source(s) 110 and ending at the surface properties of the structure 700 or at the actual medium or material of the environment itself. For example, light exit elements 108 as discussed herein may play a major role in adjusting the characteristics, and include e.g. a number of collimating structures (e.g. microstructures such as collimating grating or lenses) and/or diffusive structures (e.g. diffusive surface irregularities or lenses), for example.

Figure 5:
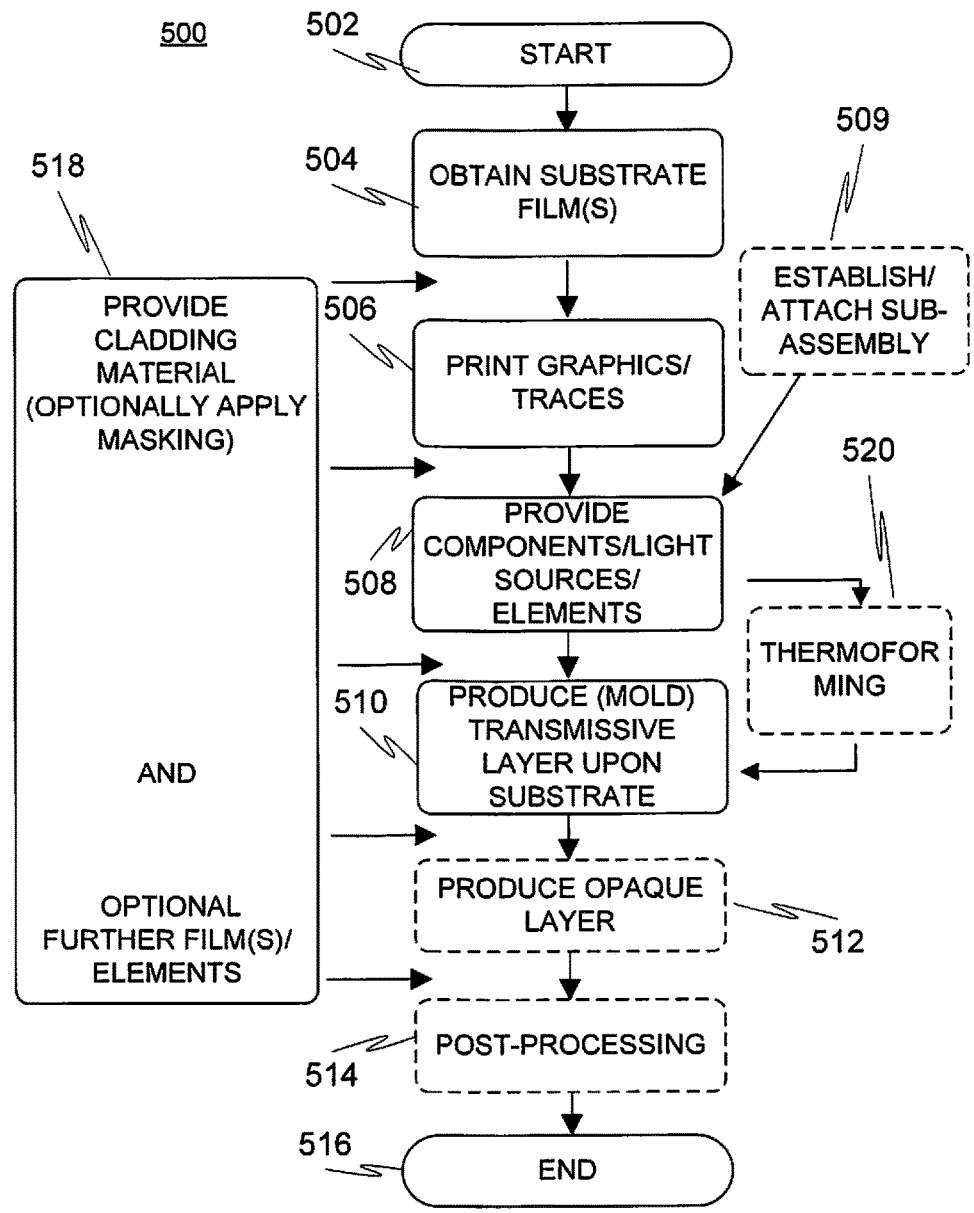
FIG. 5 is a flow diagram disclosing an embodiment of a method in accordance with the present invention.

FIG. 5 includes a flow diagram 500 disclosing an embodiment of a method in accordance with the present invention.

At the beginning of the method for manufacturing the multilayer structure, a start-up phase 502 may be executed. During start-up 502, the necessary tasks such as material, component and tools selection, acquisition, calibration and other configuration activities may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding, casting, lamination, (thermo)forming, cutting, drilling and/or printing equipment, among potential others, may be thus ramped up to operational status at this stage. Mold(s) may be prepared with necessary surface forms, etc.

At 504, at least one, optionally flexible and/or elastic substrate film or potentially other substrate element for accommodating electronics is obtained. A ready-made element of substrate material, e.g. a roll or sheet of plastic film, may be acquired. In some embodiments the substrate film itself may be first produced in-house by molding, extrusion or other methods from the desired source material(s). In some embodiments, the substrate film may be manufactured from selected source or raw materials, optionally plastics, at least partially jointly with at least one other element such as a cladding layer, which is deliberated in more detail hereinafter. Optionally, the substrate film is processed. It may be, for example, coated, cut and/or provided with openings, notches, recesses, cuts, etc. as desired. The initial and/or resulting processed film may bear e.g. rectangular, square or circular shape. The substrate film may be either generally or at least selectively in places opaque, translucent or substantially transparent having regard to selected frequencies/wavelengths of light, such as the emission frequencies/wavelengths of the light sources to be provided thereon. The substrate film may comprise thermoplastic material but as discussed hereinelsewhere, a great variety of mutually rather different materials are applicable for use in substrate and other films considered herein.

At 506, a number of conductive traces defining e.g. a number of conductor lines of a desired circuit pattern or circuit design, and/or contact pads (or other contact areas) for electrically coupling electronic components such as light sources, power (supplying) circuitry and/or control circuitry, are provided on the substrate film, preferably by one or more techniques of printed electronics with reference to related additive technologies. For example, screen, inkjet, flexographic, gravure or offset lithographic printing may be utilized. However, more traditional such a etching based methods may be considered as well, provided that e.g. the used substrate materials are compatible therewith. Also further actions cultivating the substrate film involving e.g. printing or other provision of color layers, graphics, visual indicators, coatings, etc. may take place here.

Likewise, in case there were several substrate films or generally films to be included in a target multilayer structure, each could be processed and provided with desired treatments and a number of additional elements such as components or conductors.

At 508, electronics including at least a number of light sources, optionally LEDs, are provided on the substrate film(s) potentially with one or more other electronic components such as power circuitry, sensing circuitry and/or control circuitry (e.g. a microcontroller, processor, signal processor, programmable/programmed logic chip, etc.). In practice, e.g. a number of ready-made components such as various SMDs (surface-mount device) may be attached to the selected contact areas by solder and/or adhesives, for instance. Alternatively or additionally, printed electronics technology may be applied to actually manufacture at least part of the components, such as OLEDs, directly onto the substrate film(s). Each included light source may be optionally individually selected, manufactured or otherwise configured to emit e.g. white light or just selected wavelengths/frequencies (colors), not forgetting potential non-visible wavelengths.

Additionally, a number of thermal management elements such as cooling elements comprising thermally conductive material could be provided on the film(s) and/or elsewhere in the structure, as embedded and/or upon surface, at this stage and/or during subsequent phases. For example, a heat sink, thermal slug or thermal well could be provided.

How the electronics such as light sources may be dimensioned, aligned or positioned either mutually or relative to other features of a multilayer structure under construction has been deliberated hereinearlier. In brief, the mutual positioning of various elements shall be selected such that desired overall performance goals in terms of e.g. uniformity of light outcoupled via a selected surface and/or optical efficiency are fulfilled. Yet, there may be e.g. aesthetic goals that affect the positioning of electronics and/or masking or blocking elements such that the electronics are not visible from outside the finished multilayer structure.

In some embodiments, the substrate film(s) and/or other film(s) to be included in the multilayer structure may be formed 520 to exhibit a desired 3d-shape (at least locally a substantially non-planar shape), preferably through thermoforming such as vacuum or pressure forming. Also cold forming may be applicable. Having regard to forming techniques, e.g. the aforesaid pressure forming may be applied to provide the substrate with precise, sharp details; pressure forming may also be generally preferred when the substrate lacks (through-)holes that could enable undesired flow and resulting pressure drop via them. Forming 520 may be executed subsequent to provision of electronics 508 to avoid related 3D assembly. However, it is alternatively or additionally possible to execute 3D forming already prior to phase 508.

In some embodiments, a number of sub-assemblies of electronics/sub-substrates (e.g. PCBs, printed circuit boards, already supplied with electronic component(s)) may be provided as such to any of the substrates at 509 and secured by adhesive and/or solder, for instance.

At 510, at least one, preferably but not necessarily, thermoplastic layer establishing a light conveying transmissive element for the light emitted by the light sources is provided and specifically, advantageously directly produced from the concerned material(s), e.g. through molding or casting, upon the substrate film and at least part of the electronics thereon, such as traces and a number of electronic components. Preferably at least part of the electronics such as the light sources and/or other elements provided to the substrate are thereby at least partially embedded within the provided material(s). Accordingly, optical coupling between the light sources and the transmissive element may be made efficient and associated coupling losses reduced.

In practice, one or two (substrate) films may be used as insert(s) e.g. in an injection molding process. Selected areas of the film(s) such as edges may be left free from the molded plastics if desired. In some embodiments, even both sides of a film could be provided with molded layer(s). A substrate film could comprise a through-hole or e.g. a weakened portion such as a blind-hole or a cut through which molded plastics is designed to flow e.g. in molten state from a side to another during molding.

The material of the transmissive element used is preferably at least translucent if not transparent having regard to the light emitted by the light sources. It may still exhibit at least one color. The material is associated with a first refractive index.

At 518, it is established, optionally through printing, molding, dip coating and/or spraying, optical cladding 106, such as one or more layers of selected cladding material(s), adjacent (below, top, sides, in between, etc.) the optically transmissive element upon the substrate film 102. The optical cladding may comprise material having a lower refractive index than the first refractive index, as being more thoroughly discussed hereinbefore.

In some embodiments, at least portion of, such as a layer of, the cladding 106 may be produced jointly with at least one other element such as the substrate film 102 from the associated source material(s), instead of providing the cladding e.g. on an already fully or dominantly ready-made substrate film 102. The source materials (e.g. plastic materials) may be thus provided such that they more or less simultaneously establish both at least a portion of the cladding 106 and e.g. the substrate film 102 as an aggregate, integral structure or element. Accordingly, several of the shown method items such as items 504 and 518 could be executed at least partially simultaneously instead of a more sequential approach.

Nevertheless, item 518 has been purposefully illustrated as a stretched entity, potentially connecting to the remaining process in multiple phases. Indeed, the cladding may comprise several portions such as layers that are optionally provided in multiple steps, having e.g. one or more other steps such as provision of transmissive element 518 or blocking element 512 in between.

For example, at least one layer of cladding material may be provided upon the substrate prior to (option 'a') or after (option 'b') the provision of e.g. electrical wiring/conductors 506 and/or electronic components 508 such as light sources and/or other components thereon as considered hereinbefore.

In accordance with option a, for instance, at least one cladding layer may be applied on the substrate such that selected component, conductor and/or other element locations remain cladding free, which may be due to a selective application technique utilized (e.g. printing by printed electronics technology) or masking, wherein a temporary mask may be provided at such locations beforehand and removed after more or less non-selective provision of the cladding.

In accordance with option b, for instance, at least one cladding layer may be provided onto the substrate and a number of elements already positioned thereon (wiring, electronics, and/or one or more other elements such as absorption, scattering, light exit, or other optical elements), thus essentially covering those.

Options a and b may also be flexibly combined. For instance, already installed components or other elements may be provided with a temporary mask overlay that is removed after essentially non-selective provision of the cladding layer.

One shall still remember that not all embodiments of the present invention require provision of any cladding exactly between a light-source hosting substrate and the transmissive element as there may be cladding solely elsewhere in the structure, e.g. on the opposite side and surface of the transmissive element, where there may be a further film ('additional film' 103) as well.

Thus after rather common but not mandatory provision of some cladding e.g. in accordance with option 'a' and/or 'b' already prior to item 510, item 510 may be executed.

In connection with or subsequent to item 510, optional item 512, involving provision of one or more light blocking elements as discussed hereinbefore, may be executed through molding, for instance. Preferably, two-component molding process and/or multi-shot (at least two-shot) molding equipment is used to substantially jointly execute the items 510 and 512.

After item 510, one or more portions such as layer(s) of the cladding structure may be provided 518, which may take place prior to and/or after the optional item 512 depending on the spatial configuration and dimensions of the blocking element(s) produced at 512.

For example, if at least one blocking element is going to essentially cover at least a portion, if not whole, of the transmissive element as depicted e.g. in FIG. 4, any cladding to be provided between that at least portion and the blocking element is preferably applied on the concerned portion of the transmissive element prior to the provision of the covering blocking element. When adopting the orientation of the multilayer structure as shown in FIG. 4 as a directional reference, cladding may be thus arranged to at least partially cover and contact the transmissive element from the side(s) and/or from above.

However, if e.g. a scenario reminding of the ones of FIG. 3 or 6 is considered, i.e. there will be no blocking element to cover the transmissive element at a certain region wherein cladding is still desired, at least that portion of the cladding may be conveniently provided also subsequent to the provision of the blocking element 512 in some other region(s). The cladding may be provided directly upon the transmissive element e.g. by spraying or printing, or it may be first provided on a film (additional film 103), if any, which is then attached to the remaining structure by lamination.

Yet, in situations wherein two films (the so-called substrate film and additional film) are to be included in the multilayer structure and will both at least selectively host or contact with the cladding structure so that the transmissive element and optional blocking element shall be provided between the two films, both two films may be first provided with, besides various other elements such as electronics and/or optical elements, the intended portions of the cladding and then used as inserts in a molding process during which the transmissive and optional blocking elements are provided between them. The concerned option may be applied to e.g. situations depicted in FIGS. 2 and 3. This is especially beneficial in scenarios wherein both films include elements such as electronic components and/or optical elements to be embedded in the intermediate material of the transmissive (and/or blocking) element, which may be easier during molding, i.e. when the material is generally in molten/flowing state.

Generally, when molding is applied, the concerned plastic may be injected via one or more locations e.g. from the side(s) of the insert film(s). Thus e.g. edge injection and/or hole injection (plastic injection between the films through one or more holes in the film(s)) may be applied. Alternatively, the other film for establishing e.g. the 'additional film' as called herein could be attached to an aggregate of the substrate film and transmissive element, optionally also including blocking element, afterwards by suitable lamination technique involving e.g. adhesive, pressure and/or heat based bonding.

As contemplated hereinbefore, the multilayer structure manufactured may further contain a number of other elements such as light exit elements and/or absorption or scattering elements. Such elements may be provided to the multilayer structure and e.g. a selected host element such as a film, blocking element or transmissive element therein additively (printed, sprayed or otherwise constructed from source material if not mounted as ready-made elements, for example), subtractively (a light exit element could be defined by locally removing cladding material from the surface of transmissive element, for instance) or by selectively omitting certain material from a target location (e.g. cladding material may be initially selectively introduced so as to define a hole extending therethrough, enabling effective light outcoupling or generally transmission via it). A skilled person will thus easily comprehend the fact that such elements can be provided to the multilayer structure under construction at different stages, e.g. in connection with items 518, 506, 508, or 514 depending on the nature of the element, position of the element in the structure, and overall design goal of the structure.

When the structure is generally constructed in a layered fashion, it is often beneficial to provide features in a developing multilayer stack by following the same order as they will remain in the finished structure, but as alluded to above, also removal of already provided material is possible in favor of inclusion or definition of new features whereupon following this general rule of thumb is not the sole option or to be blindly followed all the time, also considering e.g. molding solutions wherein the material of transmissive element and optional blocking element may be connected with existing but initially remote (positioned e.g. in mold halves as inserts) elements such as films potentially already hosting various other elements such as cladding, other optical features (light exit elements, scattering/absorption features) and/or electronics.

Item 514 refers to possible post-processing tasks such as the provision of additional layers and/or other elements in the structure (e.g. selectively provided surface coating or element having a protective, fastening, (electrically) connecting, tactile, and/or aesthetic or indicative function in terms of e.g. visual pattern, graphics, or color), and/or attachment of the structure to a host device, for example. For example, one or more outer layers of the structure may, when the structure is in use, face the environment and be subjected to e.g visual perception by users. Accordingly, the surface appearance and e.g. tactile feel may play a role in the overall suitability of the structure in its intended use, whereupon the outer layers may be provided with films or coatings that besides potentially having advantageous other properties (e.g. protective or connective function), also visually fit the use context in terms of colors, graphics, reflectance or other optical properties, and offer a desired surface topology in terms of e.g. roughness.

At 516, method execution is ended.

Regarding the resulting overall thickness of the obtained stacked structure, it heavily depends on the used materials and related minimum material thicknesses providing the necessary strength in view of the manufacturing and subsequent use. These aspects have to be considered on case-by-case basis. For example, the overall thickness of the structure could be about 1 mm, but considerably thicker or thinner embodiments are also feasible.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario.

The invention claimed is:

1. An integrated multilayer structure comprising:
   a substrate film having a first side and an opposing second side;
   electronics comprising at least one light source, provided upon the first side of the substrate film and a number of electrical conductors, printed by printed electronics technology, at least electrically coupled to the at least one light source, the at least one light source being configured to emit light at least in selected one or more frequencies or wavelengths, including visible light;
   an optically transmissive element comprising thermoplastic optically transmissive, having regard to the selected frequencies or wavelengths, material having a first refractive index and produced, through utilization of molding from said optically transmissive thermoplastic material, onto the first side of the substrate film so as to at least partially embed the at least one light source therewithin; and
   optical cladding comprising material having a lower refractive index than the first refractive index and provided adjacent the optically transmissive element upon the first side of the substrate film,
   wherein the at least one light source, the optically transmissive element and the optical cladding have been mutually configured so as to convey light emitted by the light source within the optically transmissive material of the optically transmissive element, at least portion of the conveyed light undergoing a substantially total internal reflection when incident upon the optical cladding.

2. The structure of claim 1, wherein the material of the optical cladding is optically substantially transparent having regard to the selected frequencies or wavelengths.

3. The structure of claim 1, wherein the optical cladding comprises several layers having at least a portion of the optically transmissive element in between, wherein two or more layers extend essentially parallel to surface and/or transverse directions of the substrate film and/or wherein the optical cladding comprises:
   a layer between the substrate film and the transmissive element, in contact with any of the film and the transmissive element, and
   other layer on the opposite side of the transmissive element relative to the substrate film, said other layer being in contact with the transmissive element and/or located between the transmissive element and light blocking element, wherein there is further cladding between the layer and the other layer, in contact with the transmissive element and connecting the layer and the other layer and/or oriented substantially transversely to the layer and the other layer.

4. The structure of claim 1, wherein the substrate film comprises, at least locally, at least one element selected from the group consisting of: optically transparent material, transmissive material, translucent material, opaque volume, transparent volume, translucent volume, transmissive volume, opaque material, opaque coating, translucent coating, optically absorptive material, optically absorptive coating, absorption area, light scattering material, scattering area, light scattering coating, reflective material, reflective coating, color film, color coating, color pigment, color dye, luminescent material, printed layer, ink, colored ink, graphical pattern, and graphical figure.

5. The structure of claim 1, further comprising a substantially opaque light absorption or scattering element positioned essentially between the substrate film and the optically transmissive element, wherein the element further exhibits at least one selected color, provided by color pigment, color dye, color coating or color film comprised in the element.

6. The structure of claim 1, further comprising at least one additional film on the optically transmissive element, on an opposite side thereof relative to a side facing the substrate film, wherein the additional film hosts or is at least adjacent at least part of the optical cladding.

7. The structure of claim 6, wherein the additional film comprises, at least locally, at least one element selected from the group consisting of: optically transparent material, transmissive material, translucent material, opaque volume, transparent volume, translucent volume, transmissive volume, opaque material, opaque coating, translucent coating, optically absorptive material, optically absorptive coating, absorptive area, light scattering material, scattering area, light scattering coating, reflective material, reflective coating, color film, color coating, color pigment, color dye, luminescent material, printed layer, ink, colored ink, graphical pattern, graphical figure, electrical element, and electronic component.

8. The structure of claim 1, comprising a light exit element arranged adjacent the optically transmissive element to outcouple light conveyed within the transmissive element and incident on the exit element from the transmissive element and from the overall structure into the environment of the structure.

9. The structure of claim 8, wherein the light exit element comprises at least one element selected from the group consisting of: through-hole defined in and by the material of the optical cladding to enable the conveyed light incident thereon to pass therethrough, surface relief structure, grating structure, prism structure, cladding free area or volume between the substrate film and the optically transmissive element the conveyed light is incident on, optical mask free area or volume between the transmissive element and the surface of the structure, refractive outcoupling element, diffractive outcoupling element, outcoupling element comprising optically substantially transmissive, translucent or substantially transparent, material having regard to the frequency or frequency band, optically transmissive material exhibiting selected one or more colors, reflective element, and outcoupling element comprising optically transmissive material with refractive index equal to or higher than the first refractive index.

10. The structure of claim 1, comprising an essentially opaque, reflective, absorptive or scattering, optical blocking element substantially adjacent the optically transmissive element and/or optical cladding, said optical blocking element defining at least portion of light propagation, leakage, or crosstalk limiting or masking structure such as of optical structures separating such as light channels separating wall and/or of a support structure within the overall structure.

11. The structure of claim 10, wherein the blocking element essentially covers or borders the transmissive element and/or optical cladding in any of surface and transverse direction of the substrate film.

12. The structure of claim 1, wherein one or more materials of the substrate film comprise at least one element selected from the group consisting of: polymer, thermoplastic material, organic material, elastomeric material, electrically insulating material, PMMA (Polymethyl methacrylate), Poly Carbonate (PC), polyimide, a copolymer of Methyl Methacrylate and Styrene (MS resin), glass, organic material, fibrous material, Polyethylene Terephthalate (PET), metal, wood, solid wood, veneer, plywood, bark, tree bark, birch bark, cork, natural leather, natural textile or fabric material, textile material, cotton, wool, linen, silk, formable material, thermoformable material and cold-formable material.

13. The structure of claim 1, wherein one or more materials of the optically transmissive element, optical cladding, an optical exit element or an optical blocking element included in the structure comprise at least one element selected from the group consisting of: polymer, thermoplastic material, elastomeric material, electrically insulating material, PC, PMMA, ABS, PET, nylon (PA, polyamide), polypropylene (PP), polystyrene (GPPS), and MS resin.

14. The structure of claim 1, comprising at least one further electrical or electronic element, located on the substrate film, including at least one element selected from the group consisting of: integrated circuit, processing unit, memory, communication unit, transceiver, transmitter, receiver, signal processor, microcontroller, battery, light sensing device, photodiode, connector, electrical connector, optical connector, power connector, diode, printed electronic component, sensor, force sensor, touch sensor, proximity sensor, antenna, inertial sensor, accelerometer, gyroscope, capacitive switch or sensor, inductive sensor, user interface element, vibration element, electrode, sensor electrode, printed sensor electrode, wireless tag, electronic sub-assembly and photovoltaic cell.

15. The structure of claim 1, wherein the substrate film and the overall structure exhibit a non-planar, three-dimensional shape.

16. A method of producing an integrated multilayer structure comprising:
    obtaining a substrate film configured to accommodate electronics on at least a first side thereof, said film having the first side and a second side;
    providing electronics comprising at least one, printable or mountable, light source upon the first side of the substrate film and a number of electrical conductors, by printed electronics technology, connecting to the at least one light source; and
    establishing, through molding or casting, an optically transmissive element onto the first side of the substrate film and thereby at least partially embedding the at least one light source, the transmissive element being established from thermoplastic optically at least translucent or transparent, material having a first refractive index,
    wherein in the method, it is also established, through printing, dip coating, spraying and/or at least partially jointly with the substrate film, optical cladding to locate adjacent the optically transmissive element upon the first side of the substrate film, said optical cladding comprising material having a lower refractive index than the first refractive index.

17. The method of claim 16, wherein at least a portion of the optical cladding is provided utilizing at least one provision technique selected from the group consisting of:
    selectively upon one or more areas on the first side of the substrate film, omitting the locations of one or more selected elements such as the location of at least one element selected from the group consisting of: the at least one light source, an electrical conductor, and a light absorption or scattering area or element, prior to provision of the one or more selected elements on the substrate film; and
    substantially non-selectively upon the first side of the substrate film already hosting at least one element further selected from the group consisting of: the at least one light source, an electrical conductor, light exit element, and light absorption or scattering element, wherein further, a masking element is first provided upon or next to the at least one element or other selected location upon the substrate film, and after provision of the optical cladding, the masking element is removed.

18. The method of claim 16, wherein the optical cladding is provided in several layers;

at least one layer thereof being provided prior to at least a portion of the transmissive element so that the transmissive element at least partially covers the at least one layer; and at least one further layer thereof being provided subsequent to the provision of the at least portion of the transmissive element and located next to and/or on top of the at least portion of the transmissive element.

19. The method of claim 16, further establishing through molding, a light blocking element from essentially opaque material onto the first side of the substrate film and substantially adjacent, next to and/or on top of, at least a portion of the optical cladding, in direct contact with the at least portion of the optical cladding.

20. The method of claim 16, comprising at least one action selected from the group consisting of:

provision of at least one additional film upon the substrate film or more specifically, upon the transmissive element wherein said at least one additional film hosts a number of graphics, electrical conductors, electrodes and/or components, provision of optical element including optically substantially opaque scattering or absorption element to the substrate film, additional film or other layer of the multilayer structure, incorporating removal of a temporary masking element therefrom after provision of cladding material also ending up on the masking element, provision of the optical cladding in several steps and layers prior to the provision of at least portion of the transmissive element upon the substrate film and/or subsequent to the provision of the at least portion of the transmissive element, provision of a light exit element adjacent or at least optically connected to the optically transmissive element, and forming, thermoforming or cold-forming, the substrate film to exhibit a target three-dimensional shape subsequent to provision of at least one element such as an electrical conductor or electronic component, such as a light source, thereon.

\* \* \* \* \*